United States Patent
Zanchi et al.

(10) Patent No.: US 9,076,554 B1
(45) Date of Patent: Jul. 7, 2015

(54) LOW-NOISE LOW-DISTORTION SIGNAL ACQUISITION CIRCUIT AND METHOD WITH REDUCED AREA UTILIZATION

(71) Applicant: Aeroflex Colorado Springs Inc., Colorado Springs, CO (US)

(72) Inventors: Alfio Zanchi, Colorado Springs, CO (US); Shinichi Hisano, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 14/260,885

(22) Filed: Apr. 24, 2014

Related U.S. Application Data

(60) Provisional application No. 61/929,867, filed on Jan. 21, 2014.

(51) Int. Cl.
*G11C 27/02* (2006.01)
*H03F 3/45* (2006.01)
*H03M 1/36* (2006.01)

(52) U.S. Cl.
CPC .............. *G11C 27/026* (2013.01); *H03F 3/45* (2013.01); *H03M 1/36* (2013.01)

(58) Field of Classification Search
CPC ............................ G11C 27/026; G11C 27/02
USPC ...................................................... 327/94, 96
See application file for complete search history.

(56) References Cited

U.S. PATENT DOCUMENTS

| | | | | | |
|---|---|---|---|---|---|
| 4,393,351 | A | * | 7/1983 | Gregorian et al. | 327/337 |
| 4,468,749 | A | * | 8/1984 | Kato et al. | 327/337 |
| 4,543,534 | A | * | 9/1985 | Temes et al. | 330/9 |
| 5,150,313 | A | * | 9/1992 | van den Engh et al. | 702/79 |
| 5,376,891 | A | * | 12/1994 | Kirchlechner | 327/3 |
| 6,556,072 | B1 | * | 4/2003 | Nicollini et al. | 327/554 |
| 7,532,042 | B2 | * | 5/2009 | Lee | 327/91 |
| 7,944,288 | B2 | * | 5/2011 | Ummelmann | 330/9 |
| 2007/0146018 | A1 | * | 6/2007 | Lee | 327/94 |
| 2013/0222335 | A1 | * | 8/2013 | Lee et al. | 345/174 |
| 2014/0098630 | A1 | * | 4/2014 | Tateyama | 367/7 |

* cited by examiner

*Primary Examiner* — Ryan Jager
(74) *Attorney, Agent, or Firm* — Hogan Lovells US LLP; Peter J. Meza

(57) ABSTRACT

A sample and hold amplifier includes an input node for receiving an input current signal, a non-linear sampling capacitor circuit having an input coupled to the input node, an operational amplifier having a negative input coupled to an output of the non-linear sampling capacitor circuit, a positive input coupled to ground, and an output for providing a sample and hold voltage signal, and a linear capacitor coupled between the negative input and the output of the operational amplifier. The non-linear sampling capacitor includes a non-linear capacitor coupled between an intermediate node and ground, a first switch coupled between the input and the intermediate node configured to switch according to a first phase signal, and a second switch coupled between the output and the intermediate node configured to switch according to a second phase signal.

14 Claims, 6 Drawing Sheets

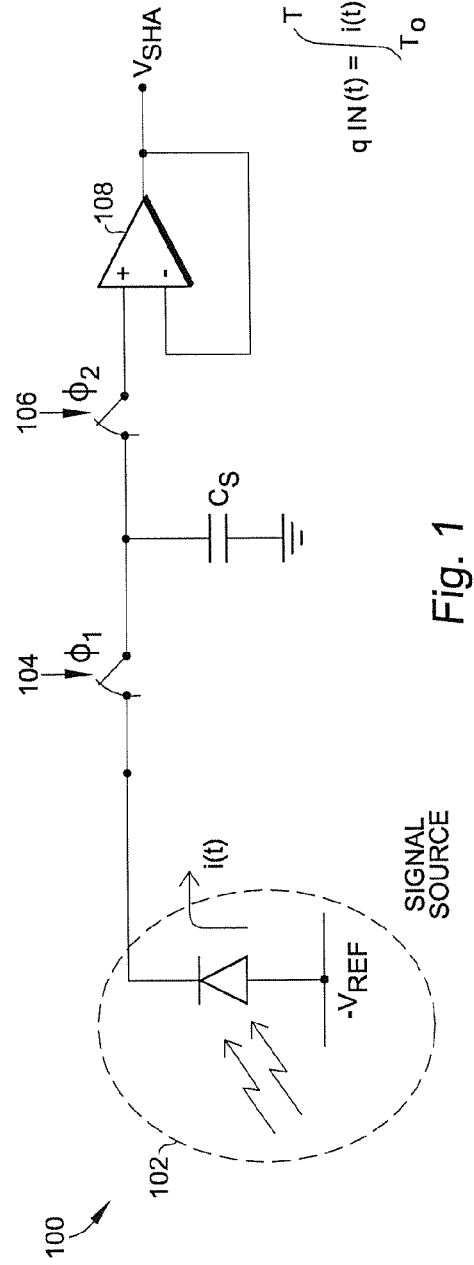
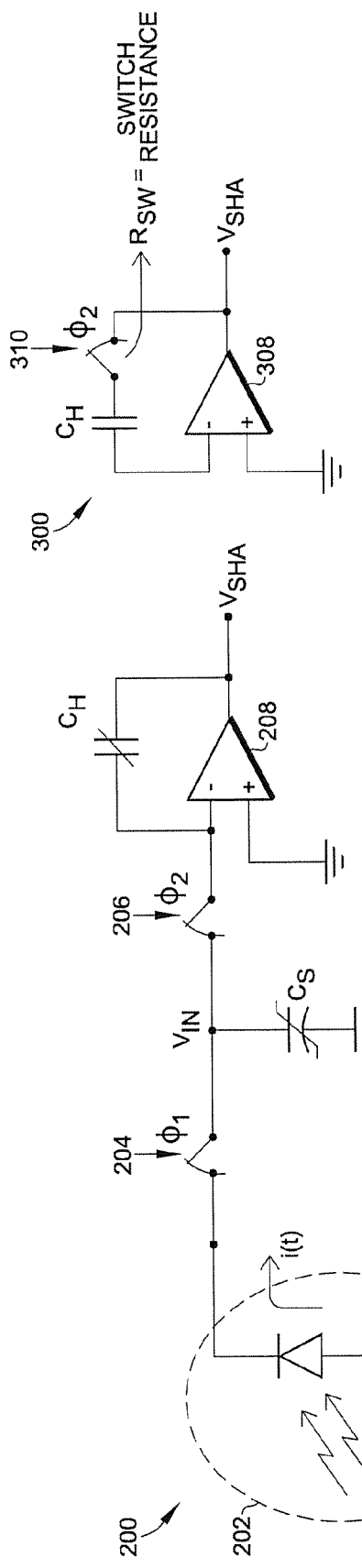
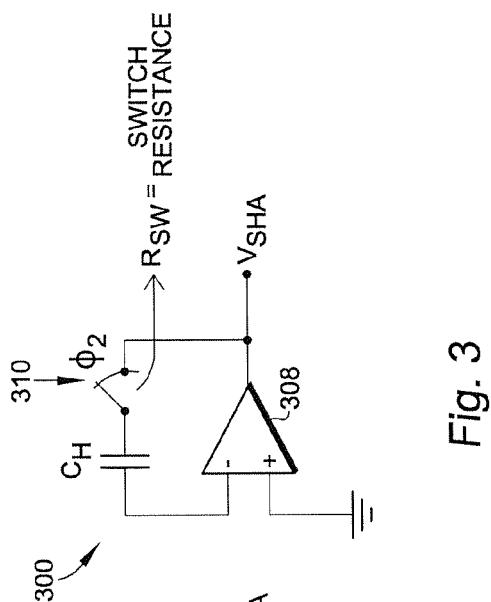
Fig. 1 Prior Art
Fig. 2
Fig. 3

LOW-NOISE LOW-DISTORTION SIGNAL ACQUISITION CIRCUIT AND METHOD WITH REDUCED AREA UTILIZATION

CROSS REFERENCE TO RELATED APPLICATION

The present application relates to and claims priority of U.S. provisional patent application ("Provisional Application"), Ser. No. 61/929,867, filed on Jan. 21, 2014. The disclosure of the Copending Provisional Application is hereby incorporated by reference in its entirety.

FIELD OF THE INVENTION

The present invention is related to sample and hold circuits and sampling systems including a plurality of sampling channels, each channel including a sample and hold circuit.

BACKGROUND OF THE INVENTION

Virtually all digitization systems interacting with the analog world are faced with the challenge of acquiring an external input signal with a circuit that minimizes noise and distortion. In fact, once the signal under observation in the external world has been corrupted by either adding noise onto it or generating spurious harmonics, its quality cannot be recovered afterwards, unless other parametric information about the input were already known; and the signal recovery method will add its own non-idealities and design burden on the whole data acquisition (DAQ) chain. This is true, for example, in the case of sampling circuits, which survey the input at discrete times (usually dictated by synchronous clock circuitry) and retain the values as observed in between adjacent samples. In this case, if the sampling apparatus is implemented, e.g., by way of a switched-capacitor circuit, the noise added by the sampler itself assumes the well-known form of kT/C wideband RMS noise; while the resistive and capacitive non-linearities of the switch introduce harmonic distortion, usually as $2^{nd}$ and $3^{rd}$ harmonic tones, to the input signal. Obviously one technique to reduce both kT/C and distortion is to increase the size of the capacitor used in the sampling process, since that automatically reduces the bandwidth of the noise and diminishes the impact of any charge injection term generated by the switch. However, this simple design choice often conflicts with the speed and especially with the area requirements of an integrated solution, in particular when the sampling circuit is employed at the front-end of a multi-channel system such as the ones found in imaging and/or bio-medical machines, which can range from 2 to 256 or more channels, activated simultaneously or in a time-staggered fashion.

FIG. 1 represents prior art of a sampling channel 100 for the acquisition of the charge signal provided by a photo-diode, which is in turn proportional to the intensity of the light (visible, or UV, or infra-red, or of another region of the electromagnetic spectrum such as X-ray radiation) sensed on a target such as a scintillator or a Photo-Multiplying Tube (PMT). The charge from the photodiode 102 is sampled by a switched-capacitor Sample/Hold (S/H) circuit including switches 104 and 106, capacitor Cs, and operational amplifier 108 configured as a buffer amplifier. The photodiode 102 may have some levels of multiplexing between the sensor and the reading electronics. Besides the issue of area, the aforementioned prior art suffers from a different potential problem: the capacitance non-linearity vs. voltage, often quantified by voltage coefficients VC1 [ppm/V] and VC2 [ppm/V$^2$], respectively for linear and quadratic dependence of the capacitance Cs on the input signal (charge q(t)). Notice that, while the coefficients have been minimized by many silicon foundries for certain types of capacitors, and they approach a few 10 ppm/V or 10 ppm/V$^2$ for low-density capacitor implementations, they can easily exceed 1000's of ppm/V or ppm/V$^2$ for the capacitor structures offering the highest densities, such as M-O-S varactor implementations. The low-noise requirement is therefore at odds with the low-distortion performance, and a low-area solution using a dense capacitor (>5 fF/µm$^2$) would provide low kT/C noise at the expense of significant distortion, as compared to the best dielectric solutions that use capacitor densities around 1 fF/µm$^2$ with the current state of the art. It would therefore be desirable to design a circuit able to minimize all three figures of merit for a S/H apparatus: noise, distortion, and area.

SUMMARY OF THE INVENTION

According to an embodiment of the present invention, a Sample and Hold (S/H) amplifier includes an input node for receiving an input current signal, a non-linear sampling capacitor circuit having an input coupled to the input node, an operational amplifier having a negative input coupled to an output of the non-linear sampling capacitor circuit, a positive input coupled to ground, and an output for providing a sample and hold voltage signal, and a linear capacitor coupled between the negative input and the output of the operational amplifier. The non-linear sampling capacitor includes a non-linear capacitor coupled between an intermediate node and ground, a first switch coupled between the input and the intermediate node configured to switch according to a first phase signal, and a second switch coupled between the output and the intermediate node configured to switch according to a second phase signal. The sample and hold amplifier can include a third switch in series connection with the linear capacitor, wherein the third switch is configured to switch according to the second phase signal. The input current signal can be provided by a photodiode.

According to another embodiment of the present invention a Sample and Hold circuit includes a plurality of sampling channels, each sampling channel including a sample and hold amplifier having a switched non-linear capacitor and a linear feedback capacitor. The sample and hold may further include a plurality of analog to digital converters respectively coupled to an output of each sampling channel, and a FIFO coupled to an output of each of the analog to digital converters. The FIFO may be coupled to the analog to digital converters through a multi-bit parallel bus and include a multi-bit parallel bus output. The sample and hold circuit may otherwise include a multiplexer having multiple inputs respectively coupled to an output of each sampling channel and an analog to digital converter having an input coupled to an output of the multiplexer. The analog to digital converter may further include a multi-bit parallel bus output.

According to another embodiment of the present invention a sample and hold amplifier includes an operational amplifier having a negative input, a positive input coupled to ground, and an output, a non-linear capacitor having a first terminal, and a second terminal coupled to the negative input of the operational amplifier, a linear capacitor having a first terminal, and a second terminal coupled to the negative input of the operational amplifier, a first switch coupled between the first terminal of the non-linear capacitor and the output of the operational amplifier, a second switch coupled between the first terminal of the non-linear capacitor and ground, a third switch coupled between an input node and the negative input of the operational amplifier, a fourth switch coupled between a first terminal of the linear capacitor and ground, and a fifth switch coupled between a first terminal of the linear capacitor and the output of the operational amplifier. The first, third, and fourth switches are configured to switch according to a first phase signal. The second and fifth switches are configured to switch according to a second phase signal. The input node constitutes a virtual ground useful for the biasing of, and receives an input current signal provided by, a photodiode. The sample and hold amplifier further includes a reset switch coupled between the negative input of the operational amplifier and the output of the operational amplifier, wherein the reset switch is configured for receiving a reset signal. The sample and hold amplifier may further include a linear load capacitor coupled to the output of the operational amplifier through a switch configured to switch according to the second phase signal.

The foregoing and other features, utilities and advantages of the invention will be apparent from the following more particular description of an embodiment of the invention as illustrated in the accompanying drawings.

BRIEF DESCRIPTION OF THE DRAWINGS

FIG. 1 is a schematic diagram of a sample and hold amplifier according to the prior art;

FIG. 2 is a schematic diagram of a first sample and hold amplifier embodiment according to the present invention;

FIG. 3 is a schematic diagram of an additional circuit detail which may be embedded or used as an alternative to the feedback path configuration in the sample and hold amplifier of FIG. 2;

DETAILED DESCRIPTION

Figure 4A:
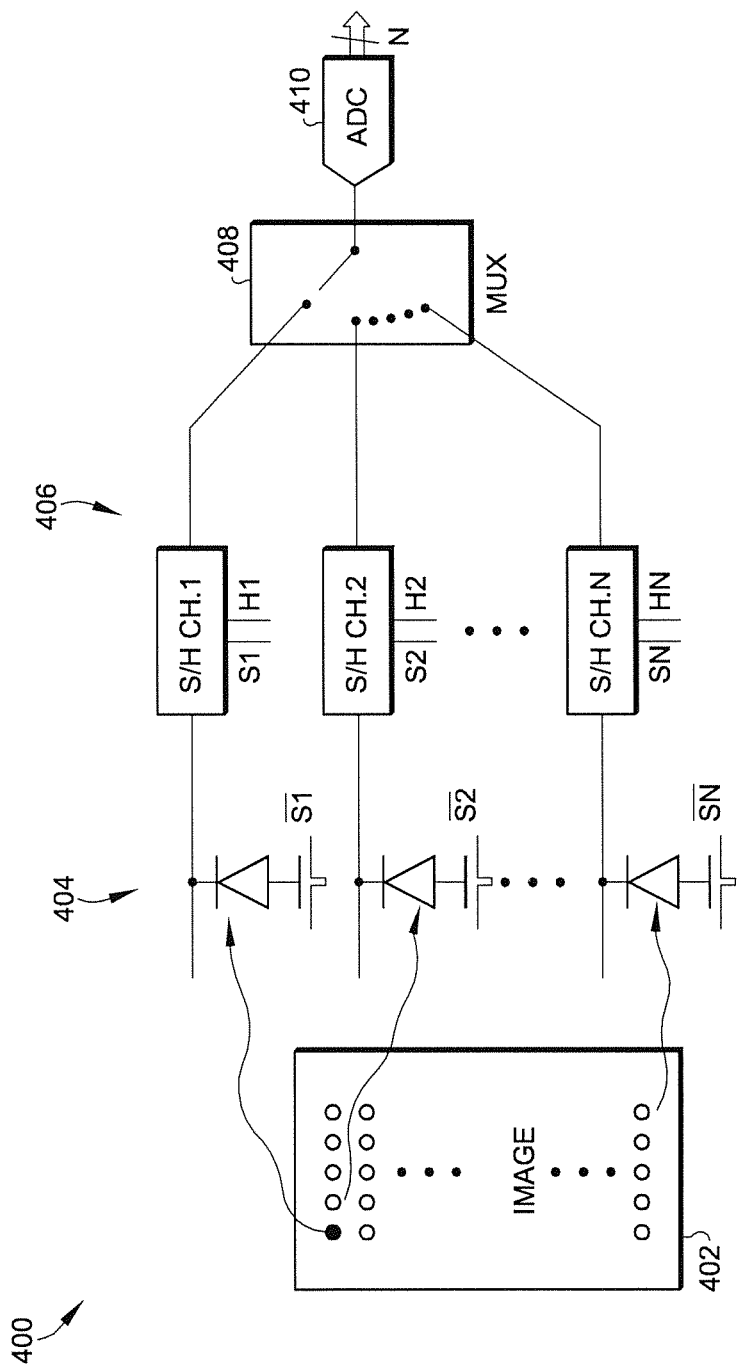
FIG. 4A is a schematic diagram of a first sample and hold circuit including a plurality of sampling channels according to the present invention.

Referring now to FIG. 2, a sample and hold amplifier 200 according to the present invention includes a sampling capacitor circuit including a non-linear capacitor Cs, a first switch 204 and a second switch 206. The first switch is switched with a first phase signal, and the second switch is switched with a second phase signal. The sampling capacitor circuit is coupled to the negative input of an operational amplifier 208. The positive input of operational amplifier 208 is coupled to ground. The output of operational amplifier 208 provides the voltage output signal $V_{SHA}$. The input current is provided by a photodiode 202, although the input current can also obviously be provided by other sources if desired.

As in the prior art, the signal current i(t) is integrated on a capacitor $C_S$ which can be made large to minimize silicon area and $kT/C_S$ noise. In a practical implementation as an I.C. (integrated circuit), $C_S$ will necessarily be non-linear (as indicated in figure by its symbol) and the voltage $V_{IN}=q_{IN}(t)/C_S$ (V) will be input-charge dependent; however the charge $q_{IN}(t)$ stored on the capacitor will be unaffected by the voltage characteristics of the device, provided the time allowed for the capacitor to get fully charged is sufficient. One aspect of the invention therefore takes advantage of this fact, as the circuit in a hold phase $\Phi_2$ extracts all the charge $q_{IN}(t)$ from $C_S$ and transfers it over a lower-density, linear capacitor $C_H$. In the figure the capacitor is indicated as linear by way of its symbol, and it is closed in the feedback loop of the operational amplifier 208; notice that "stray capacitor", parasitics-insensitive topologies can be alternatively adopted and are presented e.g. on the classic book by Gregorian and Temes "Analog CMOS Integrated Circuits for Signal Processing". Since the charge $q_{IN}(t)$ is now transferred on a smaller but linear capacitor $C_H$, the voltage $V_{SHA}$ at the output of the circuit will not suffer from harmonic distortion; and the area of $C_H$ will be a fraction, $C_S/C_H$, of the area that a direct sampling of the photocurrent i(t) onto a $C_S$ built with the same elements as $C_H$ would have required. Naturally, if the charge transfer process onto $C_H$ were as broad-band as the sampling over $C_S$, to the minimized $\sqrt{kT/C_S}$ noise RMS term we would be adding a $\sqrt{kT/C_H}$ RMS term that would exceed $\sqrt{kT/C_S}$, since $C_S > C_H$; and in the limit case of $C_S = C_H$, increase the RMS noise by $\sqrt{2}$. However, the noise power contributed by $C_H$ is not $kT/C_H$ in the arrangement of FIG. 2.

Referring now to FIG. 3 for sake of clarity, another practical implementation of the sample and hold amplifier of FIG. 2 requires at least one switch 310 in series with capacitor $C_H$ in the feedback loop of the operational amplifier 308, in lieu e.g. of switch 206 in FIG. 2. Even though such practical implementation requires at least one switch to enclose $C_H$ into the loop, the equivalent noise bandwidth of the topology is not $1/(4 \cdot R_{sw} \cdot C_H)$, since the dominant role of the loop is not simply $1/(2\pi \cdot R_{sw} \cdot C_H)$ but is proportionally lowered by the narrower bandwidth of the operational amplifier. In the limit case of no parasitic input capacitance, the operational amplifier is closed in unity-gain loop and thus its bandwidth in closed-loop equals the GBWP (Gain-BandWidth Product) of the operational amplifier itself:

$$\overline{n^2} = \int_0^{+\infty} 4kT \cdot R_{sw} \cdot BW_{closed\ loop} \cdot df \ll \int_0^{+\infty} \frac{4kT \cdot R_{sw}}{1 + (2\pi R_{sw} C_H \cdot f)^2} \cdot df = \frac{4kT \cdot R_{sw}}{4 R_{sw} C_H} = \frac{kT}{C_H} \tag{0}$$

Since the lower the bandwidth of the closed loop, i.e. the slower the amplifier, the lower the integrated noise and consequently the lower the RMS noise, the amplifier will be designed to settle in a relatively long time; this prevents the trivial application of the virtual ground technique feeding $C_H$, directly to the photodiode. In fact, the current output response of the diode will follow immediately the exposure of the illuminated target to the imager's array of photodiodes, which may be very quick to either save energy for the illumination mechanism (say, a "flash" lamp) or to avoid medical consequences of a prolonged exposure (say, during an X-ray or tomography scanning of a patient). The fast acquisition, i.e. large bandwidth, of the sampler's front-end including $C_S$ allows for capturing the incoming signal; and once the charge is stored, it can be post-processed at slower speed to preserve noise and linearity, within a small-area circuit, thanks to the de-coupling of these requirements as devised by the present invention. In the interest of preserving the throughput of the acquisition system, a staggered parallel operation of the channels can be envisioned, whereby the target of the imager is illuminated for a whole Sample+Hold period, and the image's "pixels" (picture elements) are scanned one by one by a sequential activation of the photodiodes' biases. This of course entails a predefined level of stability of the target image.

Figure 4B:
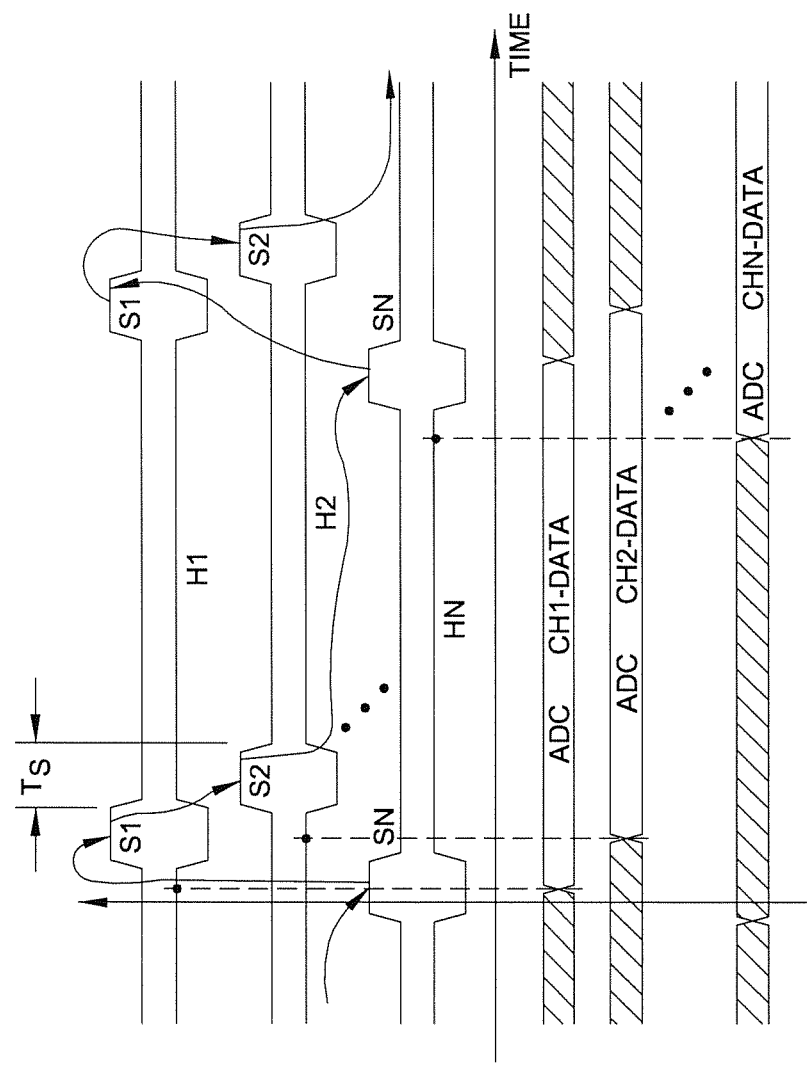
FIG. 4B is a timing diagram associated with the sample and hold circuit of FIG. 4A.

Referring now to FIG. 4A, a sample and hold circuit 400 according to the present invention is shown including an image source 402 including a plurality of photodiodes 404 for providing a plurality of input currents. Each photodiode 404 is coupled to a plurality of sample and hold channels 406, each including a sample and hold amplifier as described above according to the present invention. The analog output of each sample and hold channel in 406 is coupled to a multiplexer 408, which is in turn coupled to an ADC 410 having a multi-bit parallel (or serialized) output bus. The channel data outputs can be digitized by a fast ADC sequentially, on the fly. As shown in the timing diagram of FIG. 4B, one new data element is output every $T_S$ seconds, avoiding some channels having to sample and hold/process signals faster than others if ADC, DSP or FPGA post-processors treat them sequentially rather than in parallel.

Figure 5A:
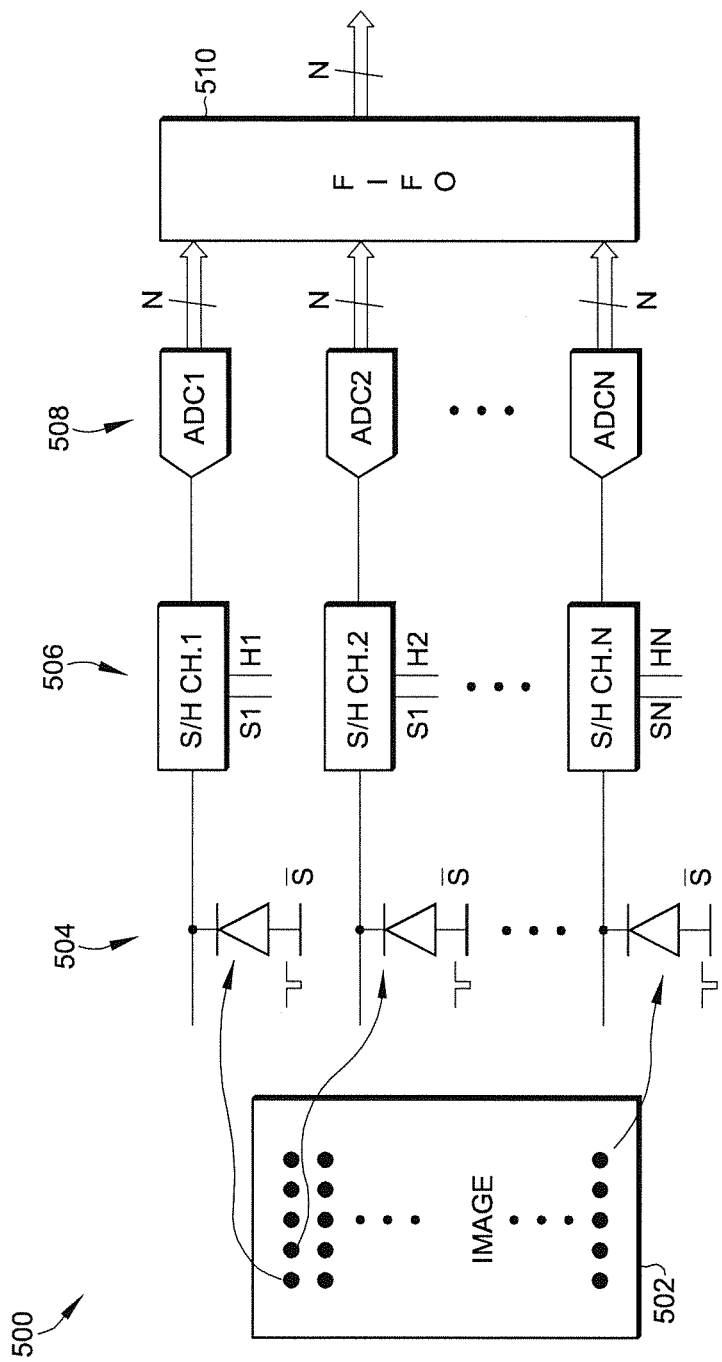
FIG. 5A is a schematic diagram of a second sample and hold circuit including a plurality of sampling channels according to the present invention.
Figure 5B:
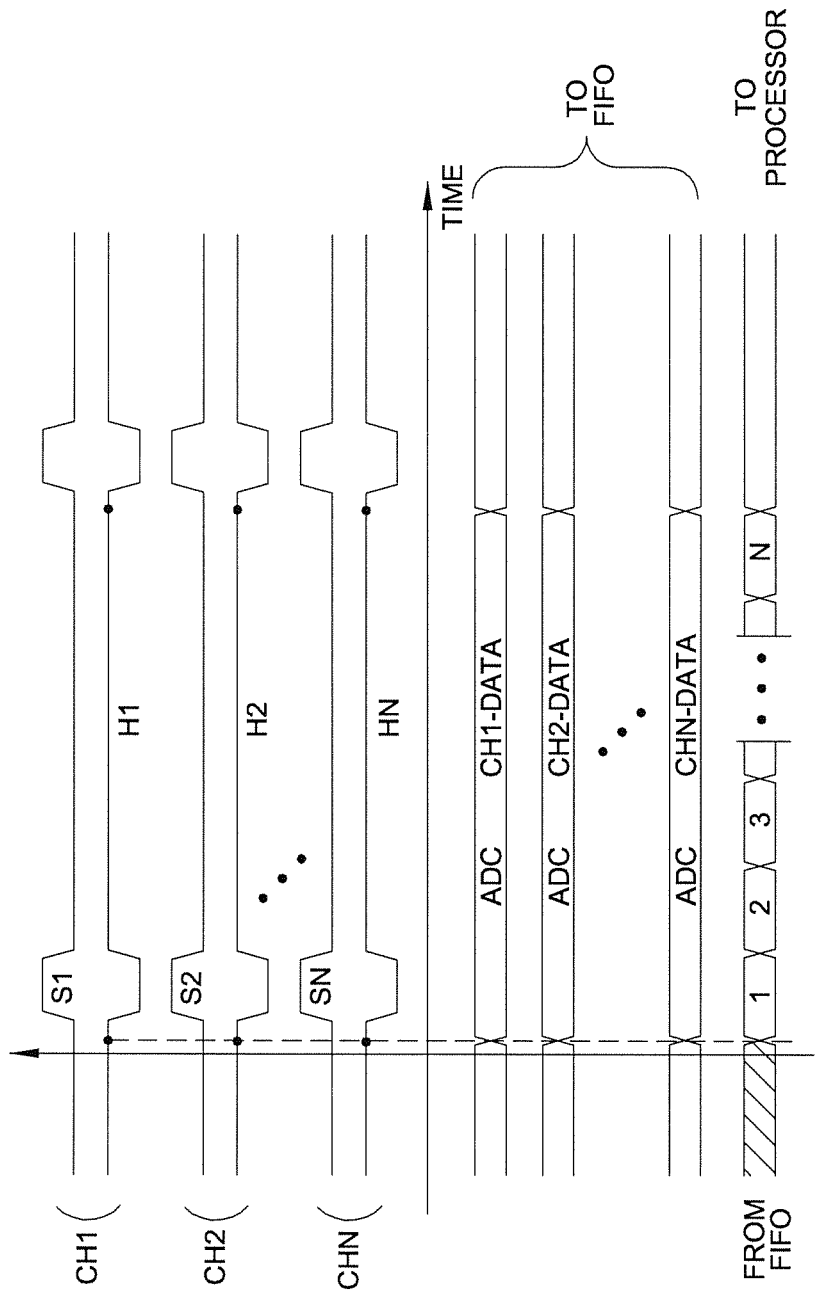
FIG. 5B is a timing diagram associated with the sample and hold circuit of FIG. 5A.

At the expense of some latency, a simultaneous Sample/Hold phase arrangement can be handled by a FIFO queue (First-In, First-Out) digital synchronization once the signal has been acquired, if every channel is digitized by a local A-to-D converter rather than multiplexed and digitized by a single ADC, as is shown in FIG. 5A. Referring now to FIG. 5A, a sample and hold circuit 500 according to the present invention is shown including an image source 502 including a plurality of photodiodes 504 for providing a plurality of input currents. Each photodiode 504 is coupled to a plurality of sample and hold channels 506, each including a sample and hold amplifier as described above according to the present invention. The output of each sample and hold channel in 506 is respectively coupled to a plurality of ADCs 508. Each ADC 508 includes a multi-bit parallel output bus, all of which are coupled to a FIFO 510. The FIFO 510 also includes a multi-bit parallel output bus. The corresponding timing diagram associated with the sample and hold circuit 500 is shown in FIG. 5B.

In conclusion, especially in a large array's paradigm, techniques exist which are fully compatible with the long hold phase that permits to abate the noise during the "re-sampling" phase of the signal onto a smaller, linear capacitor. The fast, broad-band noise acquisition of the fast input signal is instead effected on a large, non-linear capacitor. Notice that the $C_S/C_H$ signal gain inherent in the charge re-sampling is usually a desirable feature to incorporate in the acquisition system, since a gain in the front-end stage fixes the SNR (Signal-to-Noise Ratio) for the rest of the system. This entails a noise gain $1+C_S/C_H$ for the input-referred $E_n^2$ noise of the operational amplifier, which however, since it can be relatively slow, can be designed as a low-noise/low-bandwidth block. Prior art work to L. Williams III discusses a voltage sampling circuit that acquires two stages with complementary characteristics; does not mention area constraints between the two types of capacitors; and especially poses no limitations nor requirements on the noise transfer function of the front-end, with regards to the noise bandwidth limitations of the operational amplifier with element $C_H$ in feedback, which in this disclosure we have instead shown to be greatly advantageous. Notice that the arrangement in FIG. 2 causes the node $V_{IN}$ to move during the i(t) current readout, which one would avoid (if needed) by interposing a pre-amplifier with virtual ground to the invention. Since the pre-amp output voltage, and not charge, would drive the invention however, a capacitor of the same technological kind as $C_S$ would be used in feedback, as shown in FIG. 1 to Williams, whereby all the noise requirements of this invention would apply to such pre-amplifier stage as well, whose feedback capacitor would also have to be sized reasonably large for this purpose.

Finally, while the embodiment of FIG. 2 is only representative of the operation principle of the invention and is e.g. subject to stray parasitics capacitors, other implementations exist that are insensitive to such non-idealities. The fundamental requirements of capacitor type, size, operational amplifier bandwidth (or loop bandwidth at large) and sampling sequence in the case of a multi-channel implementation as stated in this invention do hold, in order for all the advantages in performance to apply as claimed.

Figure 6:
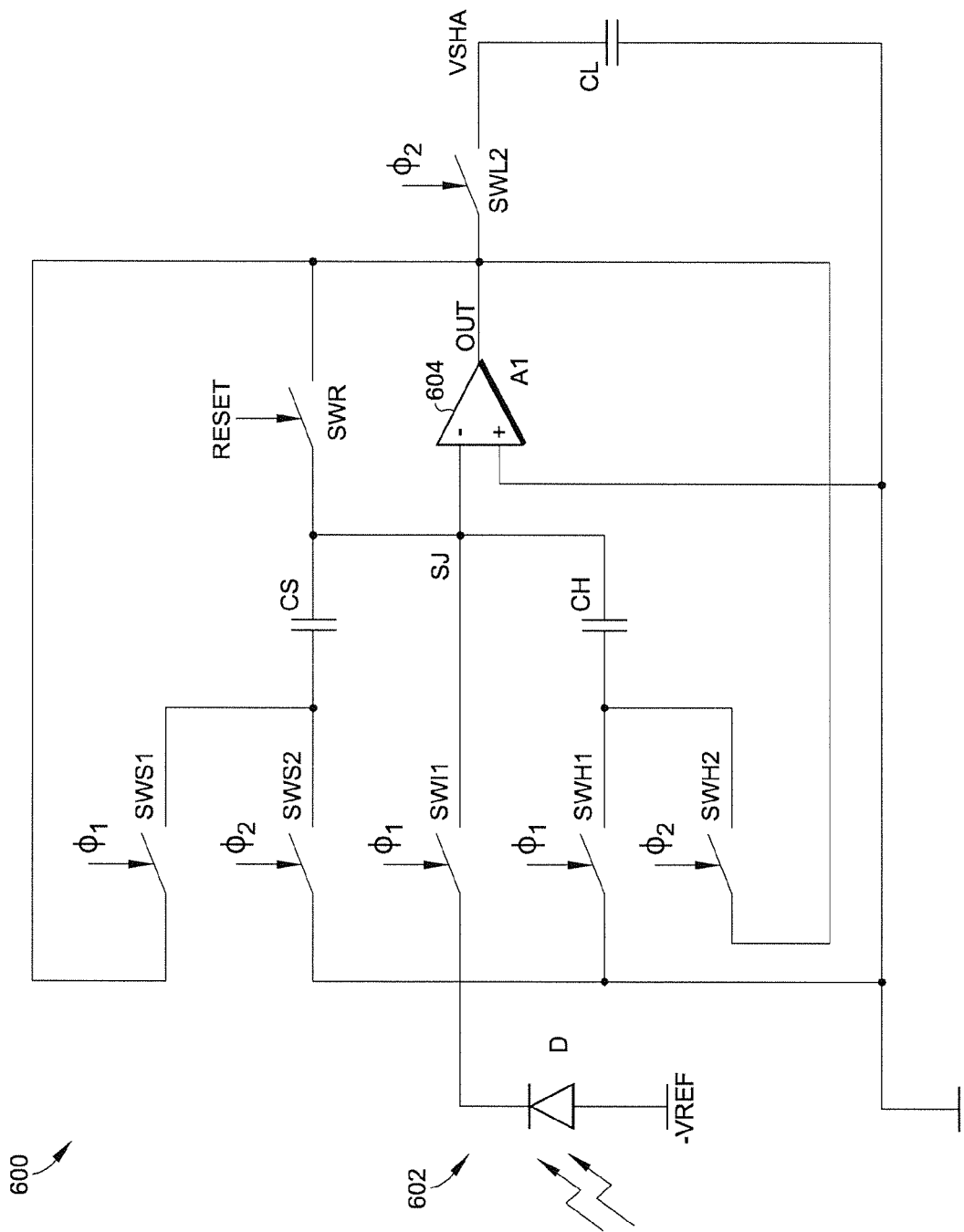
FIG. 6 is a schematic diagram of an additional sample and hold amplifier embodiment according to the present invention.

Another embodiment of the invention that maintains constant voltage during the sampling phase is illustrated in FIG. 6. Sample and Hold amplifier 600 includes a first switch SWS1, a second switch SWS2, a third switch SWI1, a fourth switch SWH1, and a fifth switch SWH2. The first, third, and fourth switches are configured to switch using the first phase signal, Φ1 and the second and fifth switches are configured to switch using the second phase signal, Φ2, as shown. The input current is provided by photodiode 602. A non-linear capacitor $C_S$ is coupled between the first and second switches and the negative input of an operational amplifier 604. The third switch is coupled between the photodiode 602 and the negative input of the operational amplifier 604. A linear capacitor $C_H$ is coupled between the fourth and fifth switches and the negative input of operational amplifier 604. The positive input of the operational amplifier 604 is coupled to ground. The output node (OUT) of the operational amplifier is coupled to a linear or non-linear load capacitor $C_L$ through switch SWL2 which receives the Φ2 signal as shown. An optional reset switch SWR is coupled between the negative input and the output of operational amplifier 604.

Two non-overlapping clock phases are denoted by Φ1 and Φ2, as noted above. The switch SWR is activated by the RESET signal to establish a proper DC operating point, by configuring the Operational Transconductance Amplifier (OTA) in FIG. 6 in unity gain mode. This RESET phase can be activated at the very initial phase of the operation prior to the sample and hold phases described below. The RESET phase may also be activated after the sample/hold dual-phase operation has started at an appropriate time in order to re-establish the initial DC operating point, if necessary.

During Φ1 (sample phase), the photodiode D is connected to the negative input of A1 (operational amplifier) via switch SWI1, injecting the signal current i(t) into node SJ. Capacitor $C_S$ is connected between SJ at its top plate and the output of A1 at its bottom plate through switch SWS1 and integrates i(t) during the Φ1 phase of the non-overlapping clock. During the Φ1 phase, capacitor $C_H$ is connected between node SJ at its top plate and ground at its bottom plate. Since A1 keeps the voltage at SJ equal to its offset voltage $V_{OS}$, $C_H$ samples the input offset voltage of A1 during the Φ1 phase. The anode terminal of the photodiode D is continuously connected to a negative reference voltage −VREF. Since its cathode terminal is held at $V_{OS}$, the voltage bias across the photodiode is kept at a constant voltage −VREF−$V_{OS}$ during the sample phase, eliminating the dependence of its signal current i(t) on the bias voltage across anode and cathode. Prior to the beginning of the sample phase at the end of the previous hold phase (Φ2), $C_S$ had been charged to $V_{OS}$ via switch SWS2. Therefore, the charge accumulated on the top plate (which is con nected to SJ) during the present sample phase (whose duration is T1) is given by:

$$Qs(\phi1) = C_S \cdot V_{OS} + \int_{t=0}^{T1} i(t) \cdot dt \quad (1)$$

The charge on the top plate of $C_H$ at node SJ during $\Phi1$ is:

$$Q_H(\Phi1) = C_H \cdot V_{OS} \quad (2)$$

The OTA A1 is designed such that during $\Phi1$, the closed loop bandwidth at −3 dB of A1 is given by:

$$Fu(\phi1) = \frac{gm}{2\pi \cdot C_S} \cdot \frac{C_S}{C_S + C_H} \quad (3)$$

In Eq.(3), $g_m$ is the transconductance of the input devices of the differential pair inside A1. The voltage noise spectral density of the predominant noise source A1 is given by 4 kT·4/(3·$g_m$), where T is the absolute temperature, and k is Boltzmann's constant. Therefore, the noise voltage across $C_S$ in phase $\Phi1$ is given by:

$$Vn^2(\emptyset1) = \quad (4)$$

$$4kT\frac{4}{3gm}\frac{gm}{2\pi \cdot C_S} \cdot \frac{\pi}{2} \cdot \frac{C_S}{C_S + C_H} \cdot \left(\frac{C_S + C_H}{C_S}\right)^2 = \frac{4kT}{3} \cdot \frac{C_S + C_H}{C_S^2}.$$

Notice this noise voltage is slightly more than $\sqrt{kT/Cs}$ because it multiplies $\sqrt{kT/Cs}$ noise by $\sqrt{(4/3) \cdot [(Cs+Ch)/Cs]}$.

In the hold phase when $\Phi2$ is active, the bottom plate of capacitor $C_S$ is driven to ground through SWS2 while its top plate is held at $V_{OS}$. The top plate of $C_H$ is at $V_{OS}$, and its bottom plate is driven by the output node OUT of A1. The charge accumulated in $C_S$ during the sample phase will all be transferred to $C_H$ with the exception of $C_S \cdot V_{OS}$ which remain across $C_S$. The charges on top plates of $C_S$ and $C_H$ in $\Phi2$ phase are given respectively by:

$$Qs(\Phi2) = C_S \cdot V_{OS} \quad (5)$$

$$Q_H(\Phi2) = C_H \cdot (V_{OS} - VOUT) \quad (6)$$

Here, VOUT is the voltage at the output of A1. The total charge held at node SJ remains constant through the two phases of the operation, namely the sample and hold phases. Therefore, $Q_S(\Phi1) + Q_H(\Phi1) = Q_S(\Phi2) + Q_H(\Phi2)$. From this equation, we obtain:

$$VOUT = -\frac{1}{C_H}\int_{t=0}^{T1} i(t) \cdot dt \quad (7)$$

The output of A1 at the end of hold phase is proportional to the time integral of the input current from the photodiode given by Eq.(7). Notice that in this circuit configuration the input offset voltage $V_{OS}$ does not affect VOUT. As previously described, the closed loop bandwidth of A1 during the hold phase ($\Phi2$) can be purposely designed to be low. By connecting the load capacitance $C_L$ during this phase, one can set the bandwidth to be reduced to:

$$Fu(\phi2) = \frac{gm}{2\pi \cdot CL} \cdot \frac{C_H}{C_H + C_S} \quad (8)$$

The noise at VOUT is therefore:

$$Vn^2(\emptyset2) = \quad (9)$$

$$4kT\frac{4}{3gm}\frac{gm}{2\pi \cdot CL} \cdot \frac{\pi}{2} \cdot \frac{C_H}{C_S + C_H} \cdot \left(\frac{C_S + C_H}{C_H}\right)^2 = \frac{4kT}{3} \cdot \frac{C_S + C_H}{C_H} \cdot \frac{1}{CL}.$$

Note that the voltage gain seen from capacitor $C_S$ around A1 in the hold phase is $C_S/C_H$. The equivalent noise in the hold phase to the same noise given by Eq.(4) is calculated as:

$$Vn^2(\phi2, \phi1) = \quad (10)$$

$$Vn^2(\phi2) \cdot (C_H/C_S)^2 = \frac{4kT}{3} \cdot \frac{C_H + C_S}{C_S^2} \cdot \frac{C_H}{CL} = Vn^2(\phi1) \cdot \frac{C_H}{CL}$$

One can set $C_L$ to be significantly larger than $C_H$, making the voltage noise at VOUT referred to the input in the hold phase much smaller than the voltage noise sensed during the sample phase.

While the invention has been particularly shown and described with reference to preferred embodiments thereof, it will be understood by those skilled in the art that various other changes in the form and details may be made without departing from the spirit and scope of the invention. It should be understood that this description has been made by way of example, and that the invention is defined by the scope of the following claims.

We claim:
1. A sample and hold amplifier comprising:
   an operational amplifier having a negative input, a positive input coupled to ground, and an output;
   a non-linear capacitor having a first terminal, and a second terminal coupled to the negative input of the operational amplifier;
   a linear capacitor having a first terminal, and a second terminal coupled to the negative input of the operational amplifier;
   a first switch coupled between the first terminal of the non-linear capacitor and the output of the operational amplifier;
   a second switch coupled between the first terminal of the non-linear capacitor and ground;
   a third switch coupled between an input node and the negative input of the operational amplifier;
   a fourth switch coupled between a first terminal of the linear capacitor and ground; and
   a fifth switch coupled between a first terminal of the linear capacitor and the output of the operational amplifier.
2. The sample and hold amplifier according to claim 1 wherein the first switch is configured to switch according to a first phase signal.
3. The sample and hold amplifier according to claim 2 wherein the third and fourth switches are configured to switch according to the first phase signal.

4. The sample and hold amplifier according to claim 1 wherein the second switch is configured to switch according to a second phase signal.

5. The sample and hold amplifier according to claim 1 wherein the fifth switch is configured to switch according to the second phase signal.

6. The sample and hold amplifier according to claim 1 wherein the input node receives an input current signal.

7. The sample and hold amplifier according to claim 6 wherein the input current signal is provided by a photodiode.

8. The sample and hold amplifier according to claim 1 further comprising a reset switch coupled between the negative input of the operational amplifier and the output of the operational amplifier.

9. The sample and hold amplifier according to claim 8 wherein the reset switch is configured for receiving a reset signal.

10. The sample and hold amplifier according to claim 1 further comprising a load capacitor coupled to the output of the operational amplifier.

11. The sample and hold amplifier according to claim 10 wherein the load capacitor comprises a linear capacitor.

12. The sample and hold amplifier according to claim 10 wherein the load capacitor is coupled to the output of the operational amplifier through a load switch.

13. The sample and hold amplifier according to claim 12 wherein at least the first switch is configured to switch according to a first phase signal and the load switch is configured to switch according to a second phase signal.

14. The sample and hold amplifier according to claim 12 wherein at least one of the third or fourth switches is configured to switch according to a first phase signal and the load switch is configured to switch according to a second phase signal.

* * * * *